United States Patent
Gao et al.

(10) Patent No.: US 12,142,620 B2
(45) Date of Patent: Nov. 12, 2024

(54) COMPLEMENTARY METAL-OXIDE SEMICONDUCTOR (CMOS) IMAGE SENSORS WITH SADDLE-GATE SOURCE FOLLOWER FOR IMAGING PIXELS

(71) Applicant: Shenzhen Goodix Technology Co., Ltd., Shenzhen (CN)

(72) Inventors: Yunfei Gao, San Diego, CA (US); Tae Seok Oh, San Diego, CA (US); Jinwen Xiao, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 326 days.

(21) Appl. No.: 17/527,065

(22) Filed: Nov. 15, 2021

(65) Prior Publication Data

US 2022/0199663 A1    Jun. 23, 2022

Related U.S. Application Data (60) Provisional application No. 63/127,494, filed on Dec. 18, 2020.

(51) Int. Cl.
*H01L 27/14*     (2006.01)
*H01L 27/146*    (2006.01)

(52) U.S. Cl.
CPC .. *H01L 27/14612* (2013.01); *H01L 27/14643* (2013.01); *H01L 27/14689* (2013.01)

(58) Field of Classification Search
CPC ......... H01L 27/14612; H01L 27/14643; H01L 27/14689; H01L 27/148; H01L 27/14
USPC ............................................ 257/291; 438/48
See application file for complete search history.

(56) References Cited

U.S. PATENT DOCUMENTS

| | | | |
|---|---|---|---|
| 2008/0210992 A1* | 9/2008 | Kim ................... | H01L 27/14603 257/292 |
| 2016/0165160 A1* | 6/2016 | Hseih .................... | H04N 25/59 348/308 |
| 2020/0176500 A1* | 6/2020 | Sze .................... | H01L 27/14614 |
| 2021/0305297 A1* | 9/2021 | Tian .................. | H01L 27/14645 |

OTHER PUBLICATIONS

M.J.H. van Dal et al., "Highly manufacturable FinFETs with sub-10nm fin width and high aspect ratio fabricated with immersion lithography" in Jul. 2007, Digest of Technical Papers—Symposium on VLSI Technology.

* cited by examiner

*Primary Examiner* — Didarul A Mazumder
(74) *Attorney, Agent, or Firm* — Kilpatrick Townsend & Stockton LLP (57) ABSTRACT

A saddle-gate source follower transistor is described, such as for integration with in-pixel circuitry of complementary metal-oxide semiconductor (CMOS) image sensor (CIS) pixels. The saddle-gate source-follower transistor structure can include a channel region having a three-dimensional geometry defined on its axial sides by trenches. A gate oxide layer is formed over the top and axial sides of the channel region, and a saddle-gate structure is formed on the gate oxide layer. As such, the saddle-gate structure includes a seat portion extending over the top of the channel region, and first and second fender portions extending over the first and second axial sides of the channel region, such that the first and second fender portions are buried below an upper surface of the semiconductor substrate (e.g., buried into trenches formed in side isolation regions).

13 Claims, 8 Drawing Sheets

(Prior Art)

FIG. 2B

(Prior Art)

COMPLEMENTARY METAL-OXIDE SEMICONDUCTOR (CMOS) IMAGE SENSORS WITH SADDLE-GATE SOURCE FOLLOWER FOR IMAGING PIXELS

CROSS-REFERENCES

This application is a non-provisional of, and claims the benefit of priority from, U.S. Provisional Patent Application No. 63/127,494, filed Dec. 18, 2020, titled "3-DIMENSIONAL FIN-SHAPED TRANSISTOR DESIGNS AND APPLICATIONS IN SEMICONDUCTOR IMAGE SENSORS," which is hereby incorporated herein by reference in its entirety.

TECHNICAL FIELD

The present document relates to complementary metal-oxide semiconductor (CMOS) image sensors. More particularly, embodiments relate to saddle-gate source follower transistor blocks for integration with in-pixel circuitry of CMOS image sensor (CIS) pixels.

BACKGROUND

Many modern electronics applications include integrated digital cameras and/or other imaging systems, which are based on complementary metal-oxide semiconductor (CMOS) image sensor (CIS) technologies. A CIS can typically include an array of pixels, each including a single photo-sensor (e.g., photodiode), or a grouping of multiple photo-sensors. Each pixel can also include supporting hardware, such as a source-follower transistor for converting the optical responses of the photo-sensors into corresponding electrical signals for use by other components. Performance of a pixel can relate to its size. For example, increasing the size of the photodiode area in the pixel can increase the photodiode's full-well capacitance (FWC), which tends to support higher dynamic range, higher contrast, and/or other image performance improvements. Similarly, increasing the active area of the source-follower transistor can improve the pixel's noise performance, such as by increasing its signal-to-noise ratio (SNR).

For any given pixel size, the footprint must be shared by both the photo-sensor(s) and the source-follower transistor. As such, any increase in the size of one forces a decrease in the size of the other, such that the pixel design conventionally represents a trade-off between image performance (relating to size and corresponding FWC of the photo-sensors) and noise performance (relating to active area of the source-follower transistor). As pixel dimensions continue to decrease, it becomes increasingly difficult to maintain acceptable noise performance (i.e., high SNR) while optimizing FWC.

BRIEF SUMMARY

Embodiments provide circuits, devices, and methods for implementing a saddle-gate source follower transistor for integration with complementary metal-oxide semiconductor (CMOS) image sensor (CIS) pixels. For example, a CIS can include a large array of imaging pixels (e.g., millions of imaging pixels). Each imaging pixel can include one or more photo-sensors to convert incident illumination into accumulated photo-charge, and in-pixel circuitry to readout and convert the accumulated photo-charge into a pixel output signal. Each in-pixel circuit includes a source-follower block in the readout chain, and embodiments of the source-follower block described herein are implemented with a saddle-gate source-follower transistor structure. The saddle-gate source-follower transistor structure can include a channel region having a three-dimensional geometry defined on its axial sides by trenches. A gate oxide layer is formed over the top and axial sides of the channel region, and a saddle-gate structure is formed on the gate oxide layer. As such, the saddle-gate structure includes a seat portion extending over the top of the channel region, and first and second fender portions extending over the first and second axial sides of the channel region, such that the first and second fender portions are buried below an upper surface of the semiconductor substrate.

According to one set of embodiments, a complementary metal-oxide semiconductor (CMOS) imaging sensor (CIS) is provided. The CIS includes an imaging pixel that has: a semiconductor substrate; a photo-sensor block comprising at least one photo-sensor configured to accumulate photocharge responsive to exposure to illumination and to transfer the accumulated photocharge to a floating diffusion region for readout; and in-pixel circuitry coupled with the floating diffusion region to convert the accumulated photocharge to a pixel output signal. The in-pixel circuitry includes a saddle-gate source-follower transistor block having: a channel region having a three-dimensional geometry that includes an upper portion having an axial length dimension and a planar width dimension, a first axial side portion defined by a first side trench to have the axial length dimension and a first fender depth dimension, and a second axial side portion defined by a second side trench to have the axial length dimension and a second fender depth dimension, the channel region being implanted with channel doping; a gate oxide layer formed over at least the upper portion, the first axial side portion, and the second axial side portion of the channel region; and a saddle-gate structure formed on the gate oxide layer to have a seat portion extending over the upper portion of the channel region, a first fender portion extending over the first axial side portion of the channel region, and a second fender portion extending over the second axial side portion of the channel region, such that the first and second fender portions are buried below an upper surface of the semiconductor substrate.

Some such embodiments also include a first side isolation region of electrical isolation material filled into a first isolation trench etched into the semiconductor substrate along at least the axial length to a first isolation-trench depth that is deeper than the first trench depth, and a second side isolation region of the electrical isolation material filled into a second isolation trench etched into the semiconductor substrate along at least the axial length to a second isolation-trench depth that is deeper than the second trench depth, wherein the first side trench is etched into the electrical isolation material of the first isolation trench, and the second side trench is etched into the electrical isolation material of the second isolation trench. Some such embodiments also include a source region and a drain region implanted into the semiconductor substrate, the source region being at a first axial end of the channel region, and the drain region being at a second axial end of the channel region opposite the first axial end and separated from the first axial end by a distance corresponding to the axial length.

According to another set of embodiments, a method is provided for fabricating a saddle-gate source-follower transistor block. The method includes: forming a channel region of the saddle-gate source-follower transistor block by: etching a first side trench to a first trench depth along an axial length of a semiconductor substrate; etching a second side trench to a second trench depth along the axial length of a semiconductor substrate, the second side trench being substantially parallel to the first side trench and separated from the first side trench by a horizontal distance, such that a three-dimensional geometry of the channel region includes an upper portion, a first axial side portion, and a second axial side portion defined according to the axial length, the horizontal distance, the first trench depth, and the second trench depth; and implanting channel doping into the semiconductor substrate according to the three-dimensional geometry of the channel region; forming a gate oxide layer on the semiconductor substrate over at least the upper portion, the first axial side portion, and the second axial side portion of the channel region; and forming a saddle-gate structure on the gate oxide layer to have a seat portion extending over the upper portion of the channel region to have a planar width dimension corresponding to the horizontal distance, a first fender portion extending over the first axial side portion of the channel region to have a first fender depth dimension corresponding to the first trench depth, and a second fender portion extending over the second axial side portion of the channel region to have a second fender depth dimension corresponding to the second trench depth.

Some such embodiments also include forming side isolation regions by: etching a first isolation trench along at least the axial length to a first isolation-trench depth that is deeper than the first trench depth; etching a second isolation trench along at least the axial length to a second isolation-trench depth that is deeper than the second trench depth; and filling the first isolation trench and the second isolation trench with electrical isolation material; wherein the first side trench is etched into the electrical isolation material of the first isolation trench, and the second side trench is etched into the electrical isolation material of the second isolation trench. Some such embodiments also include implanting a source region and a drain region into the semiconductor substrate, the source region being at a first axial end of the channel region, and the drain region being at a second axial end of the channel region opposite the first axial end and separated from the first axial end by a distance corresponding to the axial length.

The drawings, the description and the claims below provide a more detailed description of the above and other aspects of transistors with a hybrid structure, their implementations and features of the disclosed technology.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Many modern electronics applications include integrated digital cameras and/or other imaging systems, which are based on complementary metal-oxide semiconductor (CMOS) image sensor (CIS) technologies. A CIS can typically include an array of pixels, each including a single photo-sensor (e.g., photodiode), or a grouping of multiple photo-sensors. Each imaging pixel can include a photosensing element that responds to light to generate photocharge, and in-pixel circuitry for processing the generated photocharge to produce an electrical pixel output signal and for controlling operations of each imaging pixel. The in-pixel circuitry of a CIS imaging pixel typically includes a number of metal-oxide semiconductor field-effect transistors (MOSFETs) for performing sensing and control functions.

Figure 1:
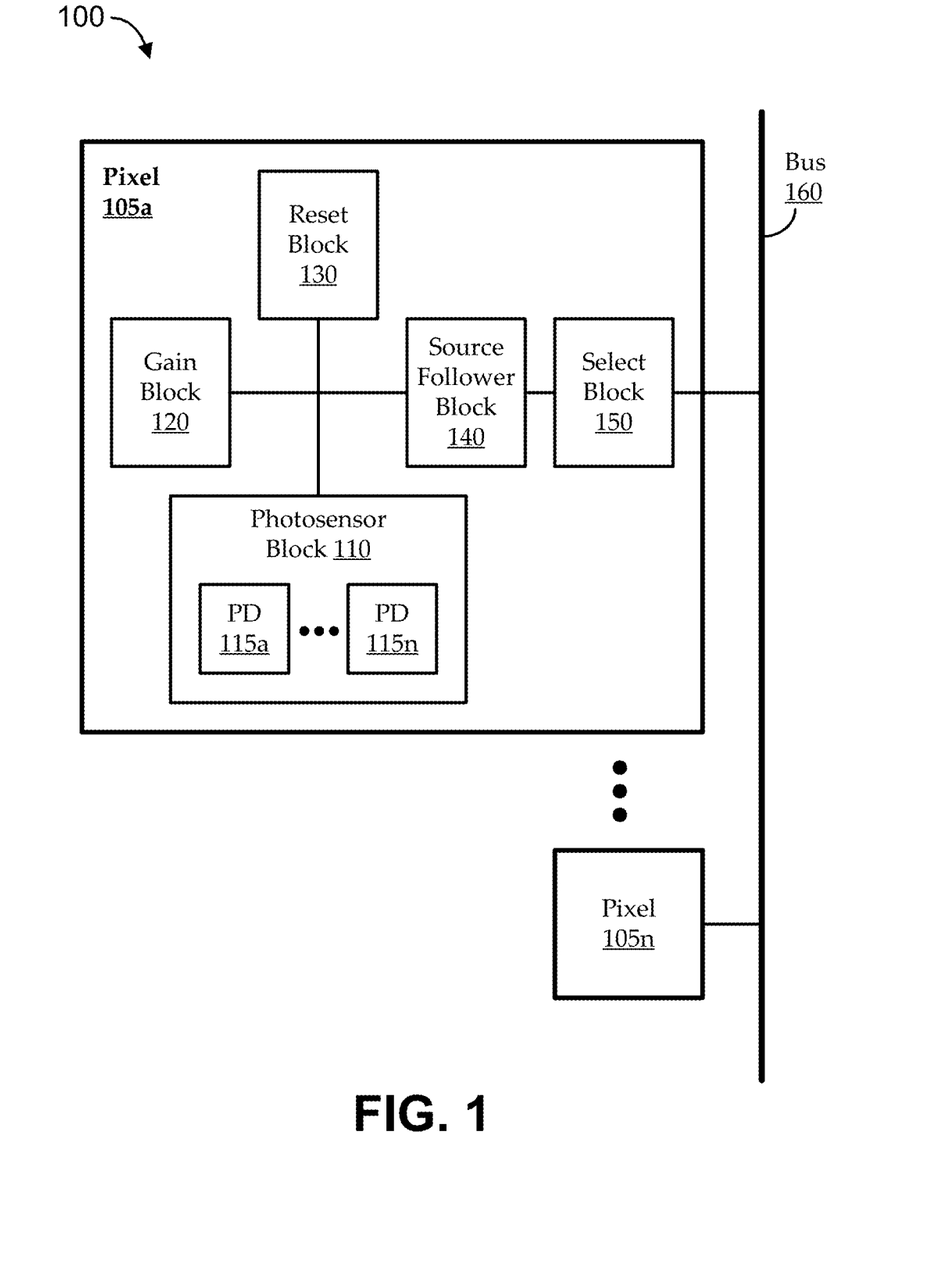
FIG. 1 shows a simplified block diagram of a portion of an illustrative digital imaging system, as context for various embodiments described herein.

FIG. 1 shows a simplified block diagram of a portion of an illustrative digital imaging system 100, as context for various embodiments described herein. The digital imaging system 100 can be built around a complementary metal-oxide semiconductor (CMOS) image sensor (CIS) technology. Such a CIS system can typically include one or more arrays of pixels 105, such as a large number of pixels 105 arranged in rows and columns. Each pixel 105 can include a photo-sensor block 110, which can include a single photodiode 115 (e.g., or any suitable photo sensor, such as a photogate, phototransistor, etc.), or a grouping of multiple photodiodes 115 (e.g., a set of four photodiodes).

The pixel 105 also includes additional components (in-pixel circuitry) to facilitate usage of the photo-sensor block 110 for optical sensing. As illustrated, embodiments can include a gain block 120, a reset block 130, a source-follower block 140, and a select block 150. Each can be implemented using at least one corresponding transistor. The gain block 120 can control gain for the pixel 105, such as by implementing dual conversion gain (DCG). The reset block 130 can selectively reset the pixel 105 components. The source-follower block 140 (implemented herein using a saddle-gate source-follower device) can support conversion of outputs from the photo-sensor block 110 into an electrical signal indicative of optical information detected by the photo-sensor block 110. The select block 150 can support selection of the pixel 105 signals from among the array of pixels 105, for example as part of a row select operation. The pixels 105 can be coupled with a readout bus 160, such as a column select bus, or the like.

As technology progresses, there has tended to be a drive in many application contexts to reduce the sizes of such pixels 105. Indeed, many digital imaging applications are seeking ever-increasing numbers and densities of pixels 105 on their image sensor chips (i.e., driving decreases in pixel 105 sizes), while also demanding that designs continue to meet or exceed multiple performance parameters, such as relating to image contrast, dynamic range, capture frame-rate, signal-to-noise ratio (SNR), power consumption, etc. However, it has been demonstrated that certain performance parameters of pixels 105 tend to be adversely impacted by reducing the sizes of components within the pixel 105. For example, decreasing the size of a photodiode 115 in the photo-sensor block 110 can decrease its full-well capacitance (FWC), which can tend to yield lower dynamic range, lower contrast, and/or other image performance reductions. Similarly, decreasing the active area of the source-follower block 140 can reduce the pixel's 105 noise performance, such as by reducing its signal-to-noise ratio (SNR). For example, decreasing the active area of the source-follower block 140 can tend to increase its susceptibility to low-frequency noise (sometimes referred to as 1/f noise), and/or burst noise (also referred to as random telegraph signal (RTS) noise, impulse noise, bi-stable noise, etc.). Some conventional pixel 105 designs seek to maximize component sizes within the limited footprint of the pixel 105, but the footprint of each pixel 105 is shared by all its components; increasing the size of one component (e.g., the photo-sensor block 110) tends to require decreasing the size of another (e.g., source-follower block 140). As such, conventional pixel 105 designs are often forced into a trade-off between image performance (relating to size and corresponding FWC of the photo-sensors) and noise performance (relating to active area of the source-follower transistor).

Figure 2A:
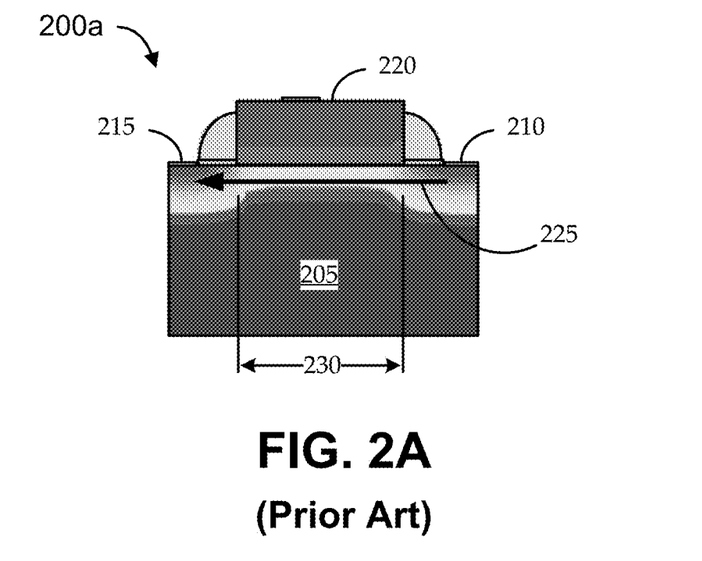
FIGS. 2A and 2B show a side cross-sectional view and a perspective view, respectively, of a conventional source-follower block implemented as a planar source-follower transistor, as is typical for conventional CIS pixel designs.
Figure 2B:
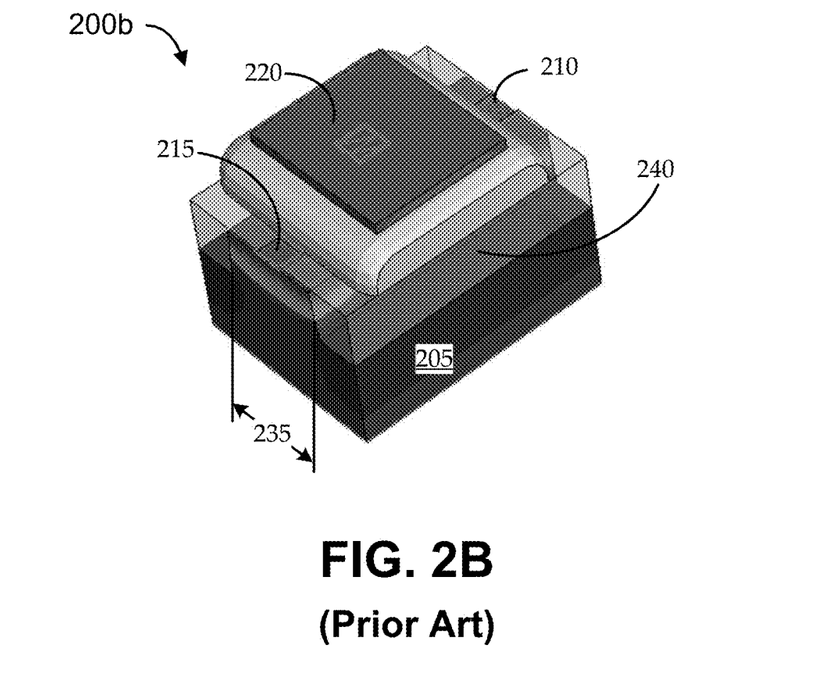

As pixel 105 dimensions continue to decrease, it is becoming increasingly difficult even to reach an acceptable trade-off between image performance and noise performance. For the sake of added context, FIGS. 2A and 2B show a side cross-sectional view and a perspective view, respectively, of a conventional source-follower block 140 implemented as a planar source-follower transistor 200, as is typical for conventional CIS pixel designs. As illustrated, the planar source-follower transistor 200 includes a drain region 210, a source region 215, and a gate region 220, all implemented on a substrate 205. For example the substrate 205 is a p-doped silicon wafer, each of the drain region 210 and the source region 215 is a respective n-doped region of the substrate 205, and the gate region 220 is a polysilicon structure deposed built (e.g., by deposition) on the substrate 205. Applying a gate voltage to the gate region 220 can cause a current channel to form and current to flow between the drain region 210 and the source region 215 in the direction of arrow 225. The length of the current channel (L) is shown as dimension 230 in FIG. 2A. The active region width (W) of the planar source-follower transistor 200 is shown in FIG. 2B as dimension 235. Also as shown in FIG. 2B, the active region can be bounded (e.g., isolated from neighboring devices) using isolation regions 240, such as shallow trench isolation (STI) regions.

Realizing a particular level of performance of a CIS pixel can involve implementing the source-follower block 140 to yield at least a threshold level of transconductance (g_m) within a threshold acceptable noise level. The amount of transconductance can functionally correspond to performance characteristics, such as frame rate, power consumption, and certain types of noise. In general, the transconductance of a generalized source-follower transistor at the saturation region can be computed as:

$$g_m = W\, C_{ox} V_{sat}$$

where W is the width of the source-follower transistor (e.g., dimension 235 of FIG. 2B in a conventional design), C_ox is the oxide capacitance, and v_sat is the saturation voltage. It can be seen that the transconductance of the source-follower transistor tends to be proportional to its width, such that a decrease in width tends to yield a corresponding decrease in transconductance-related performance.

Further, the voltage noise at the source-follower transistor gate (S_vg) can be computed as:

$$S_{Vg} = \frac{M}{C_{ox}^2 WL} \frac{1}{f^\beta}$$

where M is an empirical parameter, and β is a frequency-related parameter. The voltage signal at the source-follower transistor gate tends to be proportional to the gate capacitance, described by C_ox*W*L, where L is the current channel length (e.g., dimension 230 of FIG. 2A in a conventional design). From the gate voltage noise and the gate voltage signal, it can be derived that the SNR for the source-follower transistor is functionally related to $C\_ox^3 * W^2 * L^2$. Thus, it can be seen that the SNR of the source-follower transistor tends to be proportional to its width and length, such that a decrease in the size of the source-follower transistor tends to yield a corresponding decrease in noise performance. Notably, in conventional designs, such noise performance tends to further reduced at the device edges, such as in the isolation regions 240. For example, current flowing in the current channel can become trapped in STI regions and can contribute additional noise.

Many modern digital imaging applications have pushed pixel dimensions down to scales of around 1.12 micrometers. Even at such small scales, some conventional designs based on a planar source-follower transistor 200 have achieved sufficient transconductance ($g_m$) at an acceptable noise level to provide high CIS performance. However, as pixel dimensions continue to decrease, it becomes exceedingly difficult, impractical, or even impossible, to maintain desired levels of both transconductance ($g_m$) and SNR.

As noted above, in the conventional planar source-follower transistors 200, the gate region 220 is disposed on top of the substrate 205. Applying a gate voltage to the gate region 220 can cause a current channel to form just below surface of the substrate 205 (just below the gate region 220) between the drain region 210 and the source region 215. The length and width of the formed current channel thus relates to the length and width of the gate region 220; the physical layout width of the current channel is approximately the effective active width of the current channel. For example, reducing either the length or width of the gate region 220 will tend to reduce the length or width of the current channel, thereby impacting performance of the source follower.

Embodiments described herein provide a novel source-follower block 140 implemented using a saddle-gate source-follower transistor. In general, embodiments of saddle-gate source-follower transistors described herein include separate source and drain regions implanted in a semiconductor substrate, and a channel region extends in an axial direction between the source and drain regions. A saddle-gate structure is integrated with the substrate in such a manner that the saddle-gate structure includes a seat portion deposited above the channel region, and fender portions buried into the substrate (e.g., into previously formed isolation regions) to wrap around the axial sides of the channel region. A gate oxide layer is sandwiched between the saddle-gate structure and the channel region, such that the gate oxide layer also wraps over the top and around the axial sides of the channel region. Applying a gate voltage to a terminal patterned onto the saddle-gate structure produces electrical fields that cause a current channel to form in the channel region. An effective channel width of the saddle-gate source-follower transistor (resulting from the three-dimensional saddle-gate structure) is appreciably larger than its two-dimensional physical layout width. As such, the saddle-gate source-follower transistor can provide better performance (e.g., increases in transconductance-related and/or noise-related performance) than a conventional planar source-follower transistor of the same physical layout size.

Figure 3A:
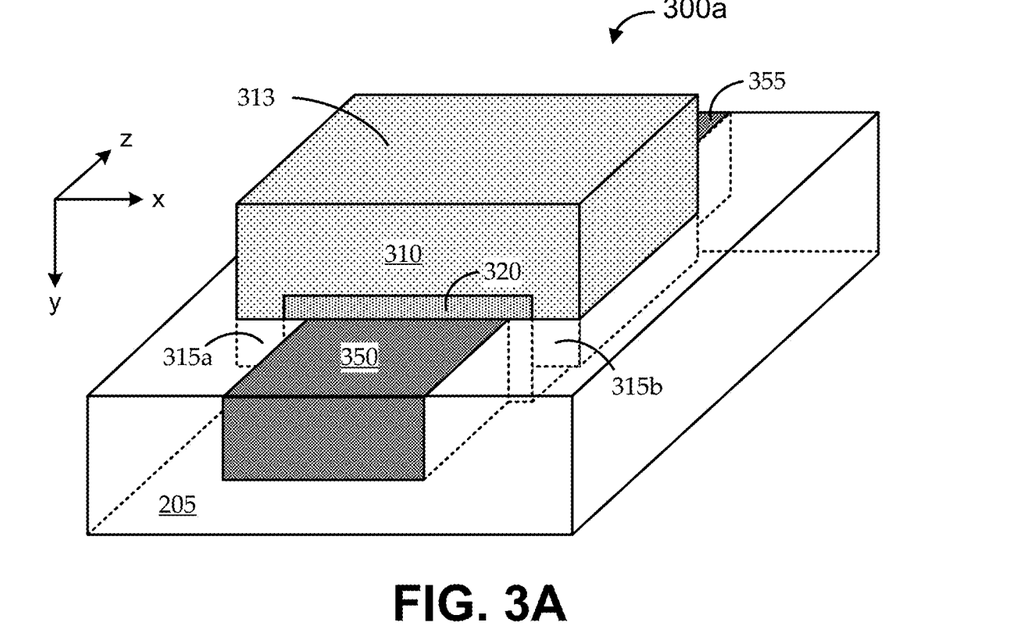
FIGS. 3A-3D show simplified views of an illustrative novel saddle-gate source-follower transistor, according to various embodiments described herein.
Figure 3B:
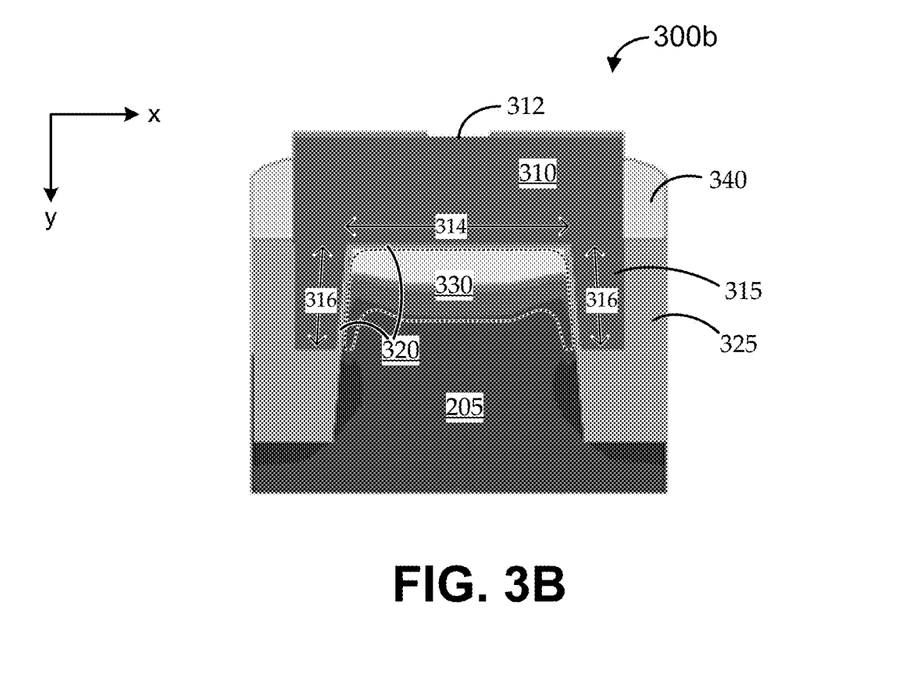
Figure 3C:
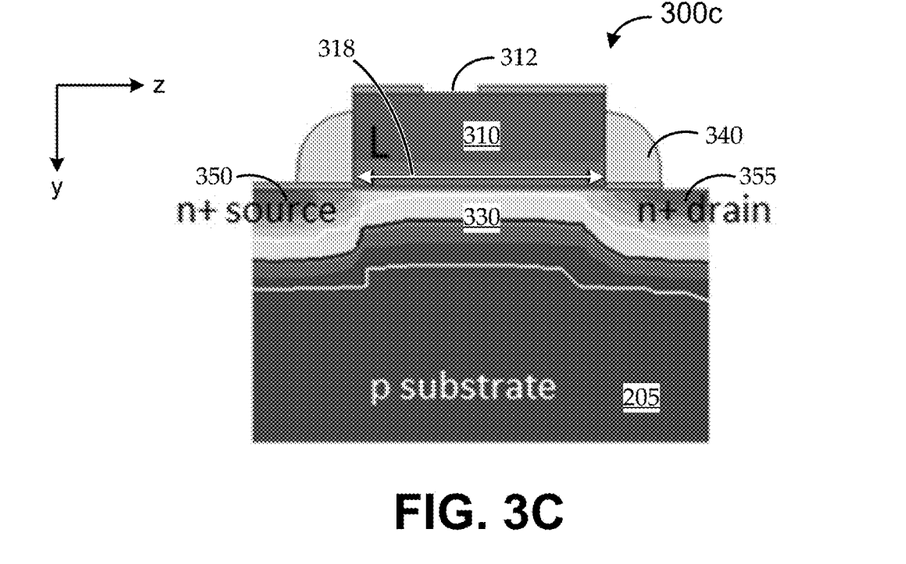
Figure 3D:
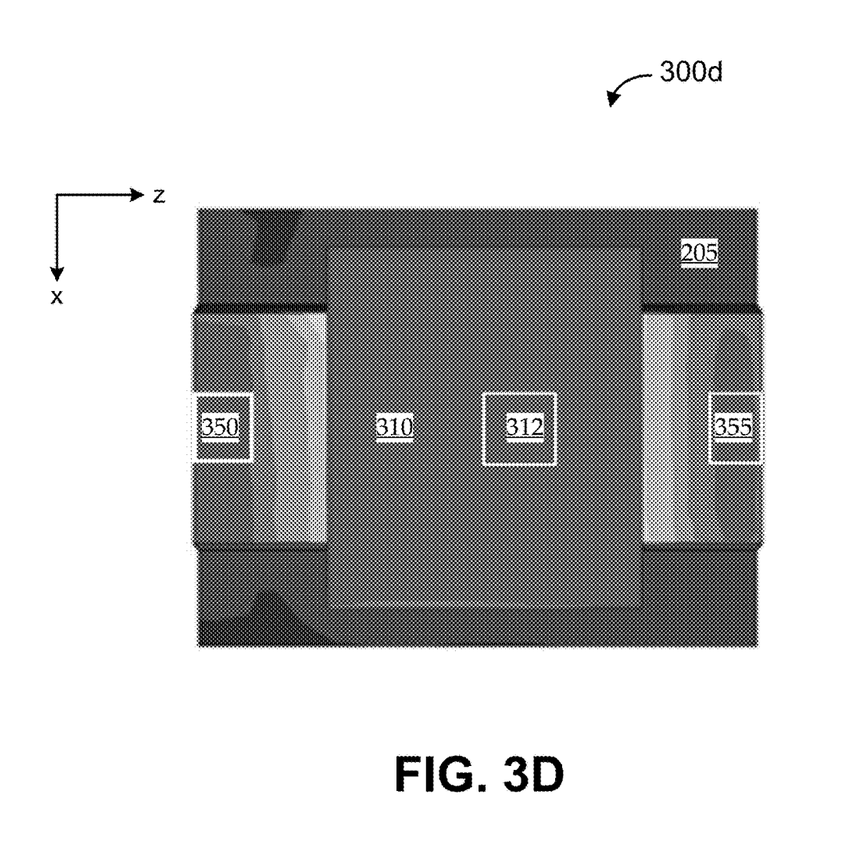

FIGS. 3A-3D show simplified views of an illustrative novel saddle-gate source-follower transistor 300, according to various embodiments described herein. The saddle-gate source-follower transistor 300 can be an implementation of the source follower block 140 of FIG. 1. FIG. 3A shows a simplified perspective view is shown as cut through a gate region of the saddle-gate source-follower transistor 300 (labeled 300a). For added clarity, FIG. 3A illustrate a reference coordinate system, in which the "z" direction runs along the length of the device (referred to as the "axial" direction herein), the "x" direction runs along the width of the device, and the "y" direction represents a vertical dimension (i.e., normal to the z-x planar layout dimensions). FIG. 3B shows a cut view (labeled 300b) corresponding to a width-wise cut through the gate of the saddle-gate source-follower transistor 300 in the x-y plane, according to the illustrated axis convention shown in FIG. 3A. FIG. 3C shows a cut view (labeled 300c) corresponding to a length-wise cut along the saddle-gate source-follower transistor 300 in the z-y plane, according to the illustrated axis convention shown in FIG. 3A. FIG. 3D shows a top planar view (labeled 300d) of the saddle-gate source-follower transistor 300, according to the illustrated axis convention shown in FIG. 3A. FIGS. 3A-3D are described together.

The saddle-gate source-follower transistor 300 is shown as supported by (i.e., implemented on, integrated with, etc.) a silicon substrate 205, such as a portion of a silicon wafer. A source region 350 and a drain region 355 are implanted in the substrate 205 and are separated by a channel region 330 that effectively defines the active region of the device. A saddle-gate structure 310 is formed to wrap over the top and down the axial sides of the channel region 330, as described more fully below. The source region 350 and the drain region 355 are typically implemented as doped wells implanted into the substrate 205 at either end of the gate, as can be seen in FIGS. 3A, 3C, and 3D. In some implementations, the substrate 205 is a p-type substrate, and the source region 350 and the drain region 355 are n-doped regions. In other implementations, the substrate 205 is an n-type substrate, and the source region 350 and the drain region 355 are p-doped regions.

As in other metal-oxide semiconductor field-effect transistor (MOSFET) devices, applying a voltage potential at a gate terminal 312 of the saddle-gate structure 310 produces an electric field that changes the conductivity of the channel region 330 between the source region 350 and the drain region 355. For example, applying at least a threshold level of voltage to the gate terminal 312 can cause a depletion region to form in the channel region 330 of the substrate 205, which allows current to flow between the source region 350 and the drain region 355. In contrast, because the saddle-gate structure 310 wraps over the top and down the axial sides of the channel region 330 as described herein, applying a voltage potential at the gate terminal 312 of the saddle-gate structure 310 produces an electric field from the top and axial sides of the channel region 330, which can produce a similar effect (e.g., with respect to noise performance, transconductance, and/or other characteristics) to that of a planar-type source follower transistor with an appreciably wider active region.

As illustrated in FIGS. 3A and 3B, the saddle-gate source-follower transistor 300 includes a gate oxide layer 320 formed on top of and around the axial sides of a channel region 330 (i.e., the sides running along the length of the channel region 330), and a saddle-gate structure 310 deposited on top of and around the axial sides of the gate oxide layer 320. The saddle-gate structure 310 can be made of a metal, an electrically conductive polysilicon material, and/or any other suitable material. In particular, the saddle-gate structure 310 includes a seat portion 313 that extends over the top of the channel region 330, and fender portions 315 that wrap around the axial sides of the channel region by being buried into the substrate 205 (e.g., or into side isolation regions, as described below). FIG. 3B shows that the seat portion 313 of the saddle-gate structure 310 forms a planar (i.e., horizontal) width dimension 314 that extends across the channel region 330 in the "x" dimension (and also extends lengthwise over the channel region 330 in the in the "z" dimension. The fender portions 315 of the saddle-gate structure 310 extend downward (i.e., generally in the "y" dimension) into the substrate 205 by a fender depth dimension 316. The fender depth dimension 316 can correspond to a maximum depth by which the buried fender portions 315 extend into the substrate 205 (e.g., into trenches etched into isolation regions previously formed in the substrate 205). In some embodiments, the fender depth dimension 316 can be greater than or equal to the planar width dimension 314. While the two fender depth dimension 316 are shown as equivalent, other embodiments can be implemented with different fender depth dimension 316 (i.e., with each of the fender portions 315 having a different respective depth).

The fender depth dimensions 316 increase the effective active region width (W) of the saddle-gate source-follower transistor 300. For example, the seat portion 313 defines a planar width dimension 314 (W) of 300 nanometers (nm), and each of the fender portions 315 defines a fender width dimension of 150 nm. In this example, the two fender portions 315 together provide an additional 300 nm of effective width, thereby doubling the effective width of the device active region to 2W. Referring to the equations provided above, it can be seen that increasing the effective width of the device active region by a factor of two can increase the SNR of the device by a factor of four. As such, a saddle-gate source-follower transistor 300 with these dimensions can manifest a SNR of approximately four times that of a conventional planar-type source follower transistor with the same planar active region width (W).

The gate oxide layer 320 acts as a dielectric layer between the saddle-gate structure 310 and the channel region 330. In particular, at least a portion of the gate oxide layer 320 is sandwiched between the saddle-gate structure 310 and the channel region 330 to form a dielectric around three sides of the channel region 330. It can be seen from FIGS. 3A-3D that the channel region 330 has a three-dimensional geometry that includes an upper portion having an axial length dimension 318 (see FIG. 3C, dimension 318 extending in the "z" direction) and the planar width dimension 314, a first axial side portion (adjacent to the first fender portion 315a of the saddle-gate structure 310) defined by a first side trench to have the axial length dimension and the first fender depth dimension 316, and a second axial side portion (adjacent to the second fender portion 315b of the saddle-gate structure 310) defined by a second side trench to have the axial length dimension and a second fender depth dimension 316. As such, as shown at least in FIGS. 3A and 3B, the gate oxide layer 320 is formed over at least the upper portion, the first axial side portion, and the second axial side portion of the channel region 330; and the saddle-gate structure 310 is formed on the gate oxide layer 320 to have its seat portion 313 extending over (i.e., generally covering the area of, and following the general contour of) the upper portion of the channel region, its first fender portion 315a extending over the first axial side portion of the channel region 330, and its second fender portion 315b extending over the second axial side portion of the channel region, such that the first and second fender portions 315 are buried below an upper surface of the semiconductor substrate 205.

Some embodiments include one or more isolation regions 325 around the outside and/or bottom of the fender portions 315 of the saddle-gate structure 310. The isolation regions 325 can be shallow trench isolation (STI). The isolation regions 325 can be made of any suitable electrical isolation material, such as un-doped polysilicon, or silicon dioxide. As described below, the isolation regions 325 can be formed prior to formation of the gate oxide layer 320 and the saddle-gate structure 310. For example, isolation trenches are etched into the substrate 205 and filled with the isolation material. Trenches are then etched into the isolation material, which can ultimately at least partially define the geometry of the fender portions 315 of the saddle-gate structure 310. The trenches etched into the isolation material also expose substrate 205 to form the axial side walls of the channel region 330. The gate oxide layer 320 can be grown around the channel region 330, including on the axial side walls of the channel region 330 exposed by the etched trenches. As illustrated, embodiments of the isolation regions 325 can be formed in deeper trenches than those used to form the fender portions 315 of the saddle-gate structure 310.

Some embodiments, include additional structures. For example, FIG. 3B shows the gate contact 312 patterned onto the seat portion 313 of the saddle-gate structure 310 and spacers 340 (e.g., nitride spacers) deposited around the saddle-gate structure 310 on the surface of the substrate 205. Though not explicitly shown, embodiments can include other structures, such as additional doping regions, etc. For example, some embodiments include an additional p-type implant along the interface between the isolation regions 325 and the substrate 205, such as to reduce dark current and temporal noise.

The views of FIGS. 3A and 3B are highly simplified views and are intended only to illustrate certain features. For example, while various regions and structures are shown as having square corners and/or defined edges, practical implementations of such regions and structures have generally organic shapes. As such, the boundaries or edges of such regions and structures practically do not have perfectly definable boundaries, and tend instead to be defined in a more statistical manner (e.g., by nominal values, process corners, etc.), as will be appreciated by those of skill in the art. Thus, the various illustrated regions and structures are intended generally to show general relative arrangements of structures and regions, general isolation between structures and regions, and the like; but are not intended to define specific shapes, sizes, boundaries, and/or other features.

The novel saddle-gate source-follower transistor 300 can be used in various different types of integrated circuit applications. Some applications use such a saddle-gate source-follower transistor 300 to implement the source follower block 140 of in-pixel circuity of an imaging pixel 105 (e.g., as shown in FIG. 1) in a semiconductor image sensor device (e.g., in a CIS). Such an image sensor device can be formed on a substrate to include an array of imaging pixels 105 supported by the substrate and operable to detect incident light to capture an image carried by the incident light. Each imaging pixel 105 can be structured to include a photosensing device or element that is responsive to a portion of incident light received by the photosensing device to produce a pixel signal indicative of the received portion of the incident light. Each imaging pixel 105 includes an in-pixel circuit coupled to receive and process the pixel signal from the photosensing device to produce a pixel output signal. Accordingly, pixel output signals from the imaging pixels collectively carry image information of an image carried by the incident light.

The in-pixel circuit in each imaging pixel 105 can include a source follower block 140 supported by the substrate based on the above saddle-gate source-follower transistor 300 design. In such an implementation, the saddle-gate source-follower transistor 300 is coupled to a floating diffusion node that is placed adjacent to the photo-sensor block 110 that converts incident light into photocharge, and the photocharge is transferred to the floating diffusion node for readout by the source follower block 140 to convert the photocharge into a voltage pixel signal representing the photocharge. Implementation of the source follower block 140 using the saddle-gate source-follower transistor 300 can reduce SNR and increase tranconductance ($g_m$) in the read-out signal chain of each imaging pixel 105.

Figure 4:
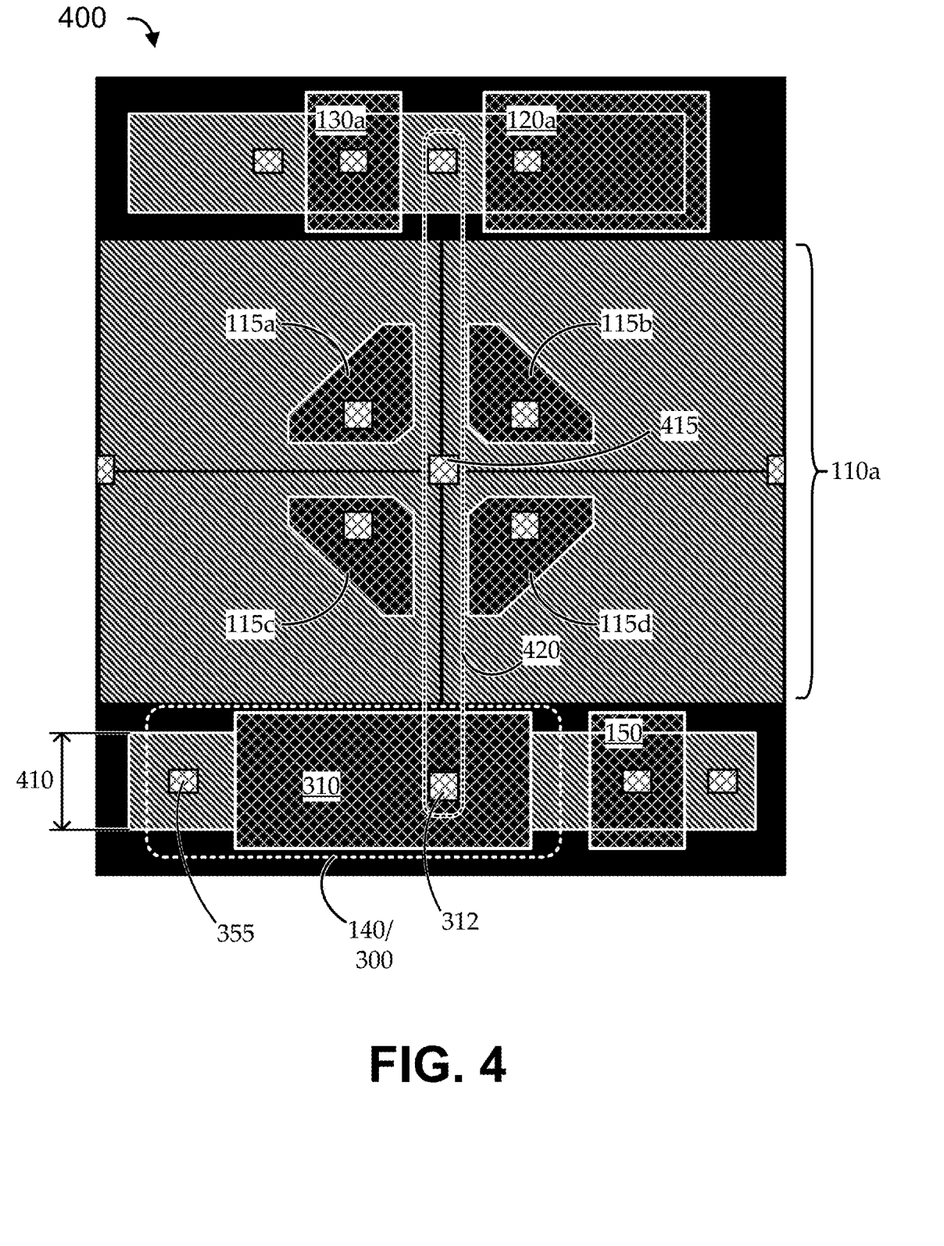
FIG. 4 shows a simplified physical layout of an illustrative CIS pixel having an integrated saddle-gate source-follower transistor with a 2-by-2 photosensor arrangement, according to various embodiments.

FIG. 4 shows a simplified physical layout of an illustrative CIS pixel 400 having an integrated saddle-gate source-follower transistor 300 with a 2-by-2 photosensor 115 arrangement, according to various embodiments. The illustrative layout can be an implementation of the block diagram of FIG. 1. A center region of the illustrated layout includes a photo-sensor block 110 with four photosensors 115 (e.g., photodiodes). An upper portion of the illustrated layout includes a gain block 120 (e.g., for DCG) and a reset block 130, with corresponding contacts. A lower portion of the illustrated layout includes a select block 150 and the novel source follower block 140, implemented as the saddle-gate source-follower transistor 300 with a saddle-gate structure 310. It can be seen that the width of the various component blocks is established by the design of the layout.

As noted above, at least because of doping parameters and the edge isolation structures, the active region of an active layer of the source follower block 140 has a definable width (W), indicated as the physical layout width 410 of the saddle-gate source-follower transistor 300. As noted above, the physical layout width 410 is based on the planar width dimension 314 of the saddle-gate source-follower transistor 300. The width 410 is determined, at least in part, by pixel design parameters and manufacturing process constraints. For example, as noted above, the pixel footprint design balances allocated space between the photo-sensor block 110 and supporting components, including the source follower block 140. The allocated space can typically define the maximum (or nominal) width of transistor components. As illustrated, embodiments of the saddle-gate source-follower transistor 300 can occupy essentially the same layout area as a conventional planar-type source-follower transistor, including occupying a same physical layout width 410. Such implementations allow the saddle-gate source-follower transistor 300 to fit within conventional spacing parameters (e.g., within typical physical design parameters of a standard 2-by-2 CIS pixel layout), including leaving desired area for the photo-sensor block 110, and allowing placing at least a drain contact 355 (generally corresponding to drain region 355) and the gate contact 312 in locations that can conform to conventional manufacturing processes for the CIS pixel 400. Some implementations further include a source contact. In other implementations, as illustrated, the source region 350 of the saddle-gate structure 310 is shared by the select block 150, and no other signals are coupled thereto; and there may be no need for a source contact. Other implementations can use other suitable physical layout dimensions in accordance with other CIS photo-sensor block designs, other manufacturing process constraints, etc.

Even in implementations where the physical layout width 410 and the physical layout channel length of the current channel are similar to those of conventional planar source-follower transistors used in conventional CIS photo-sensor blocks, the saddle-gate structure 310 can provide an appreciably larger effective active width for the device. For example, the effective width of the saddle-gate source-follower transistor 300 can correspond to the physical layout width plus the fender depth dimension 316 of each fender portion 315 of the saddle-gate structure 310. In the illustrated implementation, the four photosensors 115 are coupled with a floating diffusion node 415 to which accumulated photocharge is transferred from the photosensors 115 for readout by the in-pixel circuitry. A dashed rectangle illustrates a floating diffusion interconnect 420 by which the floating diffusion node 415 can be coupled with the gate contact 312 of the saddle-gate source-follower transistor 300 (and the source terminal of the reset block 130 and/or of the DCG block 120) as part of the readout chain for the pixel 400.

Figure 5:
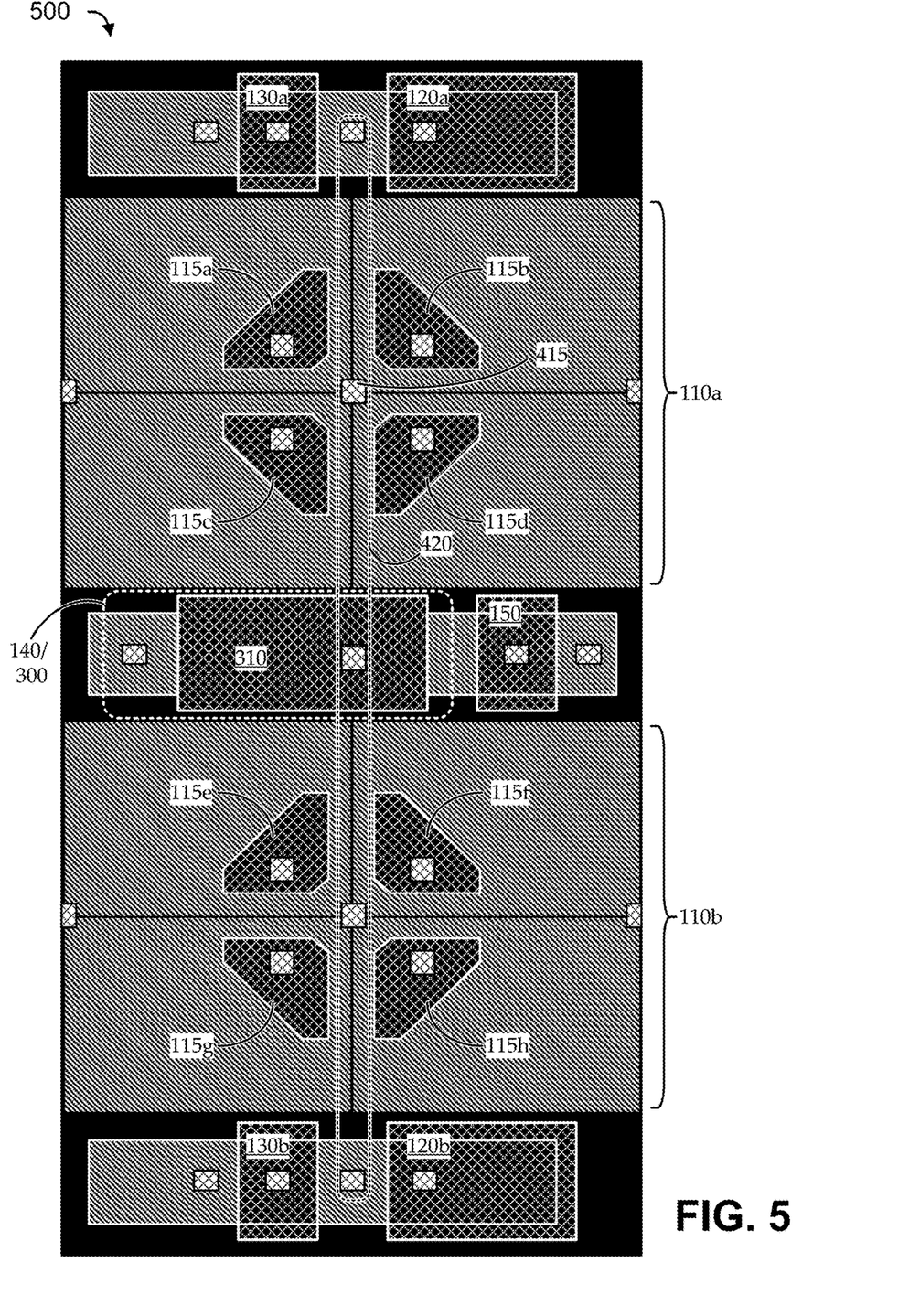
FIG. 5 shows a simplified physical layout of another illustrative CIS pixel having an integrated saddle-gate source-follower transistor with a 2-by-4 photosensor arrangement, according to various embodiments.

FIG. 5 shows a simplified physical layout of another illustrative CIS pixel 500 having an integrated saddle-gate source-follower transistor 300 with a 2-by-4 photosensor 115 arrangement, according to various embodiments. The illustrative layout is similar to the layout described with reference to FIG. 4, except that the photo-sensor block 110 is divided into two regions, each with four photosensors 115, such that the CIS pixel 500 includes eight photosensors 115 in a 2-by-4 arrangement. In the illustrated implementation, all eight photosensors 115 are coupled with the floating diffusion node 415 directly or via the floating diffusion interconnect 420, and all eight photosensors 115 share the in-pixel circuitry. For example, all eight photosensors 115 are coupled with the saddle-gate source-follower transistor 300 via the floating diffusion interconnect 420. In some implementations, the 2-by-4 photosensor 115 arrangement uses two transistors for each of the reset block 130 and the DCG block 120 (e.g., one shown above the upper portion of the photo-sensor block 110a, and one shown below the lower portion of the photo-sensor block 110b).

Figure 6:
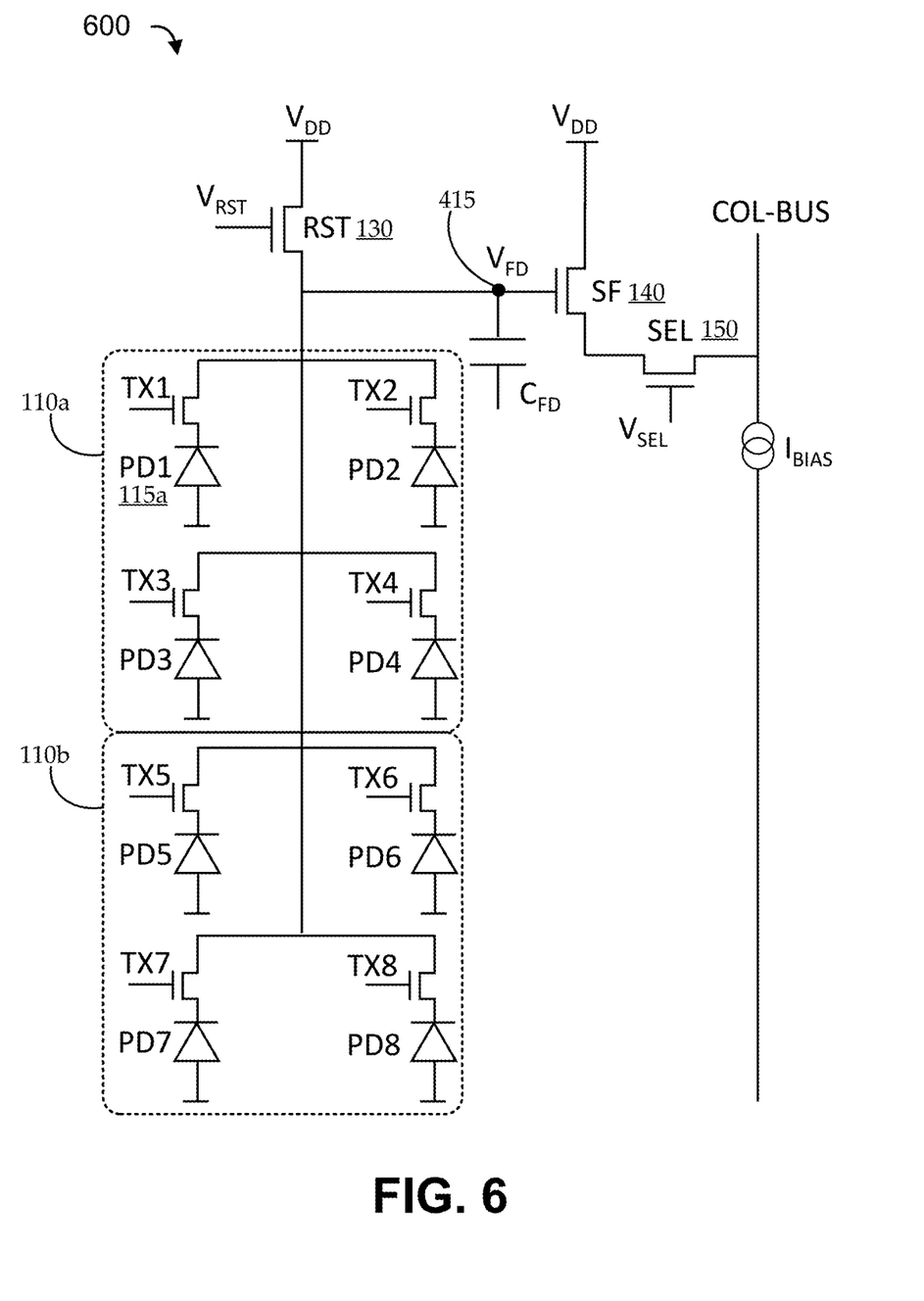
FIG. 6 shows a simplified circuit schematic diagram of a CIS pixel, according to various embodiments described herein.

FIG. 6 shows a simplified circuit schematic diagram 600 of a CIS pixel, according to various embodiments described herein. The illustrated implementation is similar to the CIS pixel 500 of FIG. 5 with a 2-by-4 photosensor 115 arrangement. By removing the portion of the schematic diagram 600 labeled 110b, the schematic diagram 600 can represent an implementation similar to the CIS pixel 400 of FIG. 4 with a 2-by-2 photosensor 115 arrangement. The schematic diagram 600 shows that all of the photosensors 115 and the gate of the photo-sensor block 140 (implemented by the saddle-gate source-follower transistor 300) are coupled with the floating diffusion node 415.

Figure 7:
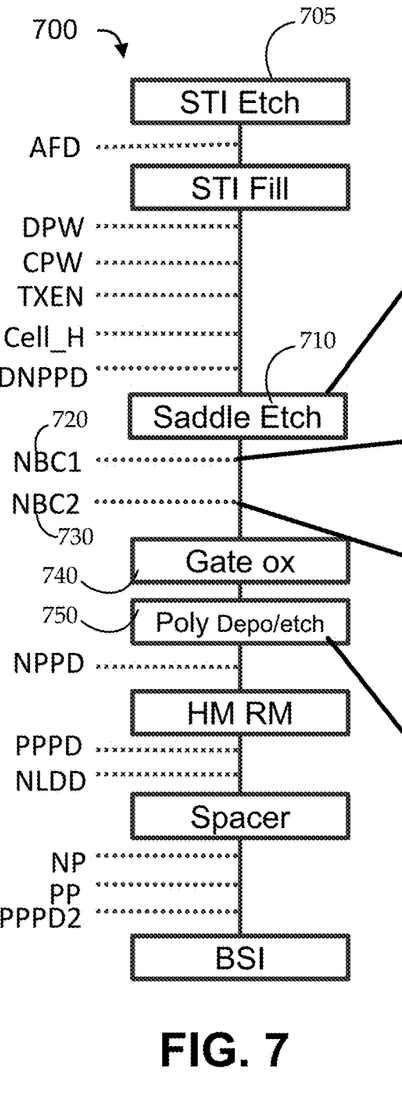
FIG. 7 shows an illustrative integrated circuit partial fabrication process for fabricating a saddle-gate source-follower transistor on a semiconductor substrate of an integrated circuit, according to various embodiments.
Figure 8A:
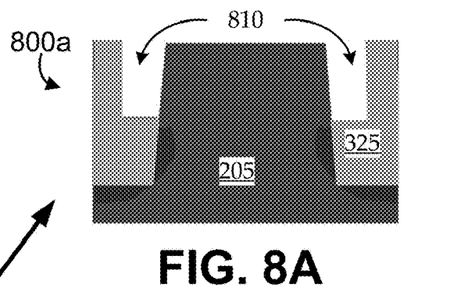
FIGS. 8A-8D show illustrative views of an in-fabrication saddle-gate source-follower transistor at various stages along the fabrication process of FIG. 7.
Figure 8B:
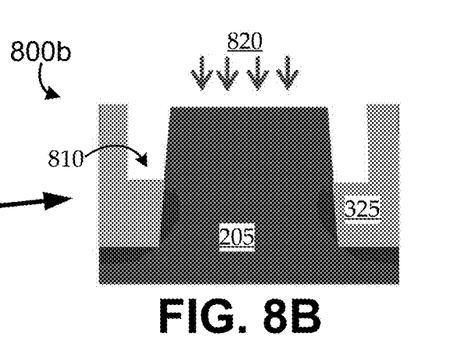
Figure 8C:
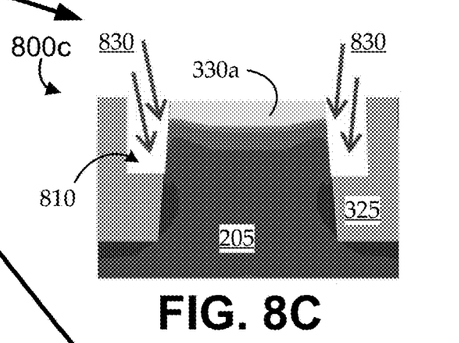
Figure 8D:
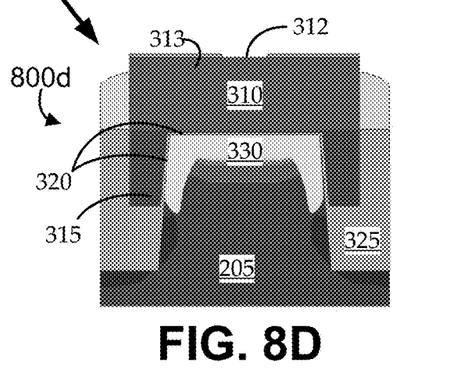

Embodiments of the saddle-gate source-follower transistor 300, including those described above, can be fabricated in various ways. FIG. 7 shows an illustrative integrated circuit partial fabrication process 700 for fabricating a saddle-gate source-follower transistor 300 on a semiconductor substrate of an integrated circuit, according to various embodiments. For added clarity, FIGS. 8A-8D show illustrative views of an in-fabrication saddle-gate source-follower transistor 800 at various stages along the fabrication process 700 of FIG. 7. It can be seen that the illustrative result of the fabrication process 700, the in-fabrication saddle-gate source-follower transistor 800d shown in FIG. 8D, is substantially identical to the saddle-gate source-follower transistor 300 shown in FIG. 3B.

The portion of the fabrication process 700 shown in FIG. 7 begins at stage 705 with etching and filling of isolation regions 325, such as shallow trench isolation (STI) regions (labeled "STI Etch" and "STI Fill"). In some implementations, etching, as used herein, is performed using photolithography. Such isolation regions 325 can isolate the source-follower transistor from other components of the CIS (e.g., adjacent blocks of the CIS pixel in which the source-follower block is incorporated). At stage 710, a "Saddle Etch" process can be performed. As illustrated in FIG. 8A, trenches 810 are etched into the substrate 205 and/or into the previously formed isolation regions 325. These trenches 810 will define the sides of the channel region and will at least partially define the geometry of the fender portions 315 of the saddle-gate structure 310.

In some embodiments, the fabrication process 700 proceeds at stages 720 and 730 by implanting a buried channel to function as the channel region 330. FIGS. 8B and 8C generally illustrate stages 720 and 730, respectively. Vertical arrows 820 in FIG. 8B represent a substantially vertical implanting being used to implant an upper portion of the buried channel into the substrate 205. Angled arrows 830 in FIG. 8C represent an angled implanting being used to implant axial side portions of the buried channel into the substrate 205 via the trenches 810. FIG. 8C also shows the upper portion of the buried channel (labeled 330a) that was implanted in the preceding FIG. 8B.

The fabrication process 700 can proceed at stages 740 and 750 by forming the gate oxide layer 320 (labeled "Gate ox") and depositing and etching the saddle-gate structure 310 (labeled "Poly Depo/etch"). The result of these stages can be seen in FIG. 8D. From stage 740, it can be seen in FIG. 8D that a gate oxide layer 320 has been formed over the top and around the axial sides of the channel region 330. For example, after the implanting stages, the gate oxide layer 320 can be grown onto the exposed surface of the substrate 205 around the top and sides of the channel region 330. From stage 750, it can be seen in FIG. 8D that the saddle-gate structure 310 is deposited and patterned to include a seat portion 313 extending over the top of the channel region 330 and fender portions 315 extending downward along the axial sides of the channel region 330, all insulated from the channel region 330 by the dielectric properties of gate oxide layer 320. For example, the saddle-gate structure 310 is formed by depositing polysilicon, masking a region of the polysilicon corresponding to the saddle-gate structure 310, and etching the unmasked portions of the polysilicon to leave behind the saddle-gate structure 310. As illustrated, a gate contact 312 can also be patterned onto the seat portion 313 of the saddle-gate structure 310.

Prior to stages 740 and 750, the resulting channel region 330 of the saddle-gate source-follower transistor 300 can include an upper portion that is implanted in stage 720 and bounded at the top by the top surface of the substrate 205, and axial side portions that are implanted in stage 730 and bounded at etched side surfaces of the substrate 205 (i.e., the inner surfaces of the trenches 810). The saddle-gate structure 310 (and gate oxide layer 320) can then be formed around the upper implanted portion and the axial side implanted portions of the channel region 330 in accordance with the top surface and the etched side surfaces of the substrate bounding the channel region 330.

It can be seen that fabrication of the gate oxide layer 320, saddle-gate structure 310, and other structures of the saddle-gate source-follower transistor 300 can be integrated with standard fabrication process techniques, such as depositing and etching. Further, other stages of the fabrication process 700 (including those preceding and following the illustrated stages) can be implemented in accordance with standard fabrication processes for MOSFETs, CIS components, etc. However, certain aspects of the illustrated fabrication process 700 are specifically tailored to the context described herein for implantation of the saddle-gate source-follower transistor 300. For example, fabrication of a conventional so-called FIN-FET transistor, which includes a gate that wraps around part of a channel region, is typically performed in a different manner from that of the illustrated fabrication process 700. For such a FIN-FET transistor, doped substrate can be formed generally in the shape of the channel region, and the gate can be deposited around the top and sides of the doped substrate, thereby fabricating a stand-alone (e.g., discrete) transistor component. Such a FIN-FET process does not include various stages of the illustrated fabrication process 700, such as etching and filling of isolation regions (stage 705), saddle etching (stage 710), etc.

Some modern CIS implementations are fabricated so that the planar layout width of the source follower is approximately 300 nm. With such a process, some implementations of the saddle-gate source-follower transistor 300 can be fabricated so that the fender portions 315 have a fender depth dimension 316 of approximately 155 nm and a width (thickness) of approximately 50 nm. Some implementations can use a high-aspect-ratio etching process that has been adopted in connection with certain memory and logic applications. In some embodiments, to maintain a desirable amount of axial side buried channel implantation (e.g., at stage 730 of the fabrication process 700), the saddle-gate structure 310 is fabricated with a fender depth dimension 316 of approximately twice the planar width dimension 314. In such embodiments, the seat portion 313 effectively contributes W to the effective active width of the device, and the fender portions 315 contribute an additional 4W to the effective active width of the device, resulting in a total five-fold increase in the effective active width of the device.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A complementary metal-oxide semiconductor (CMOS) imaging sensor (CIS) comprising:
   an imaging pixel comprising:
     a semiconductor substrate;
     a photo-sensor block comprising at least one photo-sensor configured to accumulate photocharge responsive to exposure to illumination and to transfer the accumulated photocharge to a floating diffusion region for readout;
     a first oxide diffusion region;

a second oxide diffusion region separate from the first oxide diffusion region; and in-pixel circuitry coupled with the floating diffusion region to convert the accumulated photocharge to a pixel output signal, the in-pixel circuitry comprising:
   a reset block disposed on the first oxide diffusion region and coupled with the floating diffusion region;
   a select block disposed on the second oxide diffusion region; and
   a saddle-gate source-follower transistor block disposed on the second oxide diffusion region and comprising:
      a channel region having a three-dimensional geometry that includes an upper portion having an axial length dimension and a planar width dimension, a first axial side portion defined by a first side trench to have the axial length dimension and a first fender depth dimension, and a second axial side portion defined by a second side trench to have the axial length dimension and a second fender depth dimension, the channel region being implanted with channel doping;
      a gate oxide layer formed over at least the upper portion, the first axial side portion, and the second axial side portion of the channel region; and
      a saddle-gate structure formed on the gate oxide layer to have a seat portion extending over the upper portion of the channel region, a first fender portion extending over the first axial side portion of the channel region, and a second fender portion extending over the second axial side portion of the channel region,
      such that the first and second fender portions are buried below an upper surface of the semiconductor substrate.

2. The CIS of claim 1, wherein the saddle-gate source-follower transistor block further comprises:
   a first side isolation region of electrical isolation material filled into a first isolation trench etched into the semiconductor substrate along at least the axial length dimension to a first isolation-trench depth that is deeper than the first trench depth; and
   a second side isolation region of the electrical isolation material filled into a second isolation trench etched into the semiconductor substrate along at least the axial length dimension to a second isolation-trench depth that is deeper than the second trench depth,
   wherein the first side trench is etched into the electrical isolation material of the first isolation trench, and the second side trench is etched into the electrical isolation material of the second isolation trench.

3. The CIS of claim 1, wherein the saddle-gate source-follower transistor block further comprises:
   a source region and a drain region implanted into the semiconductor substrate, the source region being at a first axial end of the channel region, and the drain region being at a second axial end of the channel region opposite the first axial end and separated from the first axial end by a distance corresponding to the axial length dimension.

4. The CIS of claim 1, wherein the channel region is implanted with the channel doping, such that the channel region comprises:
   an upper implanted portion formed by implanting of the channel doping into the upper portion of the channel region;
   a first axial side implanted portion formed by angled implanting of the channel doping into the first axial side portion of the channel region via the first side trench prior to forming the gate oxide layer and the saddle-gate structure; and
   a second axial side implanted portion formed by angled implanting of the channel doping into the second axial side portion of the channel region via the second side trench prior to forming the gate oxide layer and the saddle-gate structure.

5. The CIS of claim 1, wherein the saddle-gate source-follower transistor block further comprises:
   a gate contact patterned onto the saddle-gate structure and coupled with the floating diffusion region.

6. The CIS of claim 1, wherein each of the first fender depth dimension and the second fender depth dimension is greater than or equal to the planar width dimension.

7. The CIS of claim 1, wherein
   the select block and the saddle-gate source-follower transistor block share a doped source region implanted into the second oxide diffusion region.

8. The CIS of claim 1, wherein:
   the photo-sensor block comprises a 2-by-2 array of photo-sensors all sharing the floating diffusion region for readout.

9. The CIS of claim 1, wherein:
   the photo-sensor block comprises a 2-by-4 array of photo-sensors all sharing the floating diffusion region for readout.

10. The CIS of claim 9, wherein:
    the reset block is a first reset block; and
    the imaging pixel further comprises:
       a third oxide diffusion region to support a second reset block coupled with the floating diffusion region.

11. The CIS of claim 2, wherein the electrical isolation material is one of un-doped polysilicon or silicon dioxide.

12. The CIS of claim 8, wherein the first and second oxide diffusion regions are disposed on opposite sides of the 2-by-2 array of photo-sensors.

13. The CIS of claim 10, wherein the 2-by-4 array of photo-sensors comprises a first 2-by-2 array of photo-sensors disposed between the first and second oxide diffusion regions, and a second 2-by-2 array of photo-sensors disposed between the third and second oxide diffusion regions.

* * * * *